US012451321B2

(12) United States Patent
Van Der Toorn et al.

(10) Patent No.: US 12,451,321 B2
(45) Date of Patent: Oct. 21, 2025

(54) APPARATUS FOR OBTAINING OPTICAL MEASUREMENTS IN A CHARGED PARTICLE APPARATUS

(71) Applicant: ASML Netherlands B.V., Veldhoven (NL)

(72) Inventors: Jan-Gerard Cornelis Van Der Toorn, Eindhoven (NL); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 752 days.

(21) Appl. No.: 17/420,123

(22) PCT Filed: Dec. 19, 2019

(86) PCT No.: PCT/EP2019/086461
§ 371 (c)(1),
(2) Date: Jun. 30, 2021

(87) PCT Pub. No.: WO2020/141091
PCT Pub. Date: Jul. 9, 2020

(65) Prior Publication Data

US 2022/0084777 A1 Mar. 17, 2022

Related U.S. Application Data

(60) Provisional application No. 62/786,905, filed on Dec. 31, 2018.

(51) Int. Cl.
*H01J 37/09* (2006.01)
*H01J 37/00* (2006.01)
*H01J 37/22* (2006.01)

(52) U.S. Cl.
CPC .............. *H01J 37/09* (2013.01); *H01J 37/00* (2013.01); *H01J 37/226* (2013.01); *H01J 2237/026* (2013.01)

(58) Field of Classification Search
CPC .......... H01J 37/09; H01J 37/226; H01J 37/22; H01J 2237/026
See application file for complete search history.

(56) References Cited

U.S. PATENT DOCUMENTS 4,786,806 A 11/1988 Listl
4,902,930 A * 2/1990 Van Der Mast ....... B82Y 10/00 315/12.1

(Continued)

FOREIGN PATENT DOCUMENTS

CN 103219432 A * 7/2013
EP 0312653 A1 4/1989

(Continued)

OTHER PUBLICATIONS

Anonymous: "Indium tin oxide—Wikipedia", Nov. 6, 2018, XP055690630, Retrieved from the internet (12 pgs.): URL:https://en.wikipedia.org/w/index.php?title=Indium_tin_oxide&oldid=867630768.

(Continued)

*Primary Examiner* — David E Smith
(74) *Attorney, Agent, or Firm* — FINNEGAN, HENDERSON, FARABOW, GARRETT & DUNNER LLP

(57) ABSTRACT

A charged particle inspection system may include a shielding plate having an aperture or more than one aperture, for example, to permit additional inspection by an additional instrument requiring a line of sight to the area of interest. A field shaping element, such as a window element or a raised rim, is placed at the aperture to prevent or reduce a component of an electric field.

16 Claims, 6 Drawing Sheets

(56) References Cited

U.S. PATENT DOCUMENTS

| | | | | |
|---|---|---|---|---|
| 6,963,437 | B2 * | 11/2005 | Bauer | H10F 77/50 257/E31.118 |
| 7,507,357 | B2 * | 3/2009 | Abe | H10F 71/138 204/192.15 |
| 9,245,709 | B1 | 1/2016 | Frosien | |
| 2011/0031394 | A1 | 2/2011 | Knowles et al. | |
| 2012/0228495 | A1 * | 9/2012 | Kalachev | G01N 21/658 427/8 |
| 2013/0270438 | A1 | 10/2013 | Lanio et al. | |
| 2016/0035537 | A1 * | 2/2016 | Erel | H01J 37/026 250/307 |
| 2017/0062679 | A1 * | 3/2017 | Lee | H01L 25/0753 |
| 2018/0122530 | A1 * | 5/2018 | Li | H01B 13/0036 |
| 2018/0358199 | A1 * | 12/2018 | Kumamoto | H01J 37/28 |

FOREIGN PATENT DOCUMENTS

| | | | | |
|---|---|---|---|---|
| EP | 1587128 | A1 | 10/2005 | |
| EP | 1724809 | A1 * | 11/2006 | H01J 37/228 |
| EP | 2551889 | A1 | 1/2013 | |
| TW | 200809246 | A | 2/2008 | |
| TW | 201805987 | A | 2/2018 | |
| WO | WO 2011/070890 | A1 | 6/2011 | |
| WO | WO-2018025849 | A1 * | 2/2018 | H01J 37/04 |

OTHER PUBLICATIONS

International Search Report issued by the International Searching Authority in related International Application No. PCT/EP2019/086461, mailed Apr. 12, 2021 (6 pgs.).

* cited by examiner

APPARATUS FOR OBTAINING OPTICAL MEASUREMENTS IN A CHARGED PARTICLE APPARATUS

CROSS-REFERENCE TO RELATED APPLICATIONS

This application claims priority to International Application No. PCT/EP2019/086461, filed Dec. 19, 2019, and published as WO 2020/141091 A2, which claims priority of U.S. application 62/786,905 which was filed on Dec. 31, 2018. The contents of these applications are incorporated herein by reference in their entireties.

TECHNICAL FIELD

The embodiments provided herein relate to a charged particle apparatus with one or more charged particle beams, such as an electron microscopy apparatus utilizing one or more electron beams.

BACKGROUND

Integrated circuits are made by creating patterns on a wafer, also called a substrate. The wafer is supported on a wafer stage in the equipment for creating the pattern. One part of the process for making the integrated circuits involves looking at or "inspecting" parts of the wafer and/or the wafer stage. This may be done with a scanning electron microscope. Even with a scanning electron microscope there are instances where it is also desired to be able to inspect portions of the wafer and/or the wafer stage optically, that is, light-based, for example, with an optical microscope.

The scanning electron microscope may, however, have a metal plate slightly above the wafer stage to smooth out the electrical field around the inspected area in combination with a conductive plate or surface surrounding and or covering the wafer underneath, mounted on the wafer stage. This shield is also useful in preventing discharges due to high electric fields around the edge of the mentioned conductive area on the wafer stage. For visual inspection and alignment of the wafer and stage with an optical microscope the optical microscope is located above the large flat metal plate and looking downward through a hole in this plate. The hole in the plate disrupts the smoothness of the electrical fields the plate is intended to smooth, leading to unwanted electrical discharges.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, there is disclosed an article comprising a substantially planar plate comprising an electrically conductive material and structure defining a through aperture, and a field shaping element. The field shaping element may comprise a window element positioned at the through aperture, the window element being electrically conductive and transmissive to light. The window element may comprise an electrically conductive material transmissive to the portion of the spectrum in or near visible light, for example, having a wavelength in the range of about 300 nm to about 1100 nm. The window element may comprise a transparent metal oxide which may be indium tin oxide. The window element may comprise graphene. The window element may comprise carbon nanotubes. The window element may comprise an amorphous material. The window element may comprise a doped transparent semiconductor. The window element may comprise a conductive polymer.

The window element may comprise a body comprising a transparent material and coating of a conductive material. The coating of the conductive material may comprise gold. The coating of the conductive material may comprise aluminum. The coating of the conductive material may comprise titanium. The coating of the conductive material may comprise chromium. The coating may have a thickness in a range of about 10 nm to about 10 μm.

The window element may comprise a screen configured to be electrically conductive and transmissive to visible light. The screen may comprise a mesh. The mesh may comprise metallic wires. The mesh may be at least 30% open. The screen may be nonwoven such as a grid and may be at least 30% open.

The window element may be positioned in the aperture so as not to extend beyond a surface of the plate, for example, so as to be recessed below a surface of the plate. An area of the plate adjacent the aperture may be raised, for example, such that a height of the aperture is substantially equal to a width of the aperture. The aperture may be circular in which case the width of the aperture is a diameter of the aperture.

The field shaping element may also or alternatively comprise an area of the plate adjacent the aperture that is raised to define a raised rim, for example, such that a height of the rim is substantially equal to or greater than a width of the aperture. The aperture may be circular in which case the width of the aperture is a diameter of the aperture.

According to another aspect of an embodiment, there is disclosed an inspection tool comprising a stage arranged to support an article to be inspected and to connect the article to a voltage source, a substantially planar plate comprising an electrically conductive material and arranged parallel to and separated from the stage by a gap and to regulate an electrical field in the gap, the plate further comprising structure defining a through aperture, and a field shaping element. The field shaping element may comprise a window element positioned in the through aperture, the window element being electrically conductive and transmissive to light. The window element construction and placement, and the characteristics of the aperture, may be as described above. Here and elsewhere, "regulate" has its ordinary meaning of control and includes making the field more homogeneous and controlling the magnitude and/or gradient of the field and in particular making either zero.

According to another aspect of an embodiment, there is disclosed an inspection tool comprising a stage arranged to support an article to be inspected and to connect the article to a voltage source, a substantially planar plate comprising an electrically conductive material and arranged parallel to and separated from the stage by a gap and to regulate an electrical field in the gap, the plate further comprising structure defining a through aperture, a window element positioned in the through aperture, the window element being electrically conductive and transmissive to light, and an optical measurement device arranged to view the stage through the window element. The window element construction and placement, and the characteristics of the aperture, may be as described above.

The field shaping element may also or alternatively comprise an area of the plate adjacent the aperture that is raised to define a raised rim, for example, such that a height of the rim is substantially equal to or greater than a width of the aperture. The aperture may be circular in which case the width of the aperture is a diameter of the aperture.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF FIGURES

The accompanying drawings, which are incorporated herein and form part of the specification, illustrate the present invention and, together with the description, further serve to explain the principles of the present invention and to enable a person skilled in the relevant art(s) to make and use the present invention.

DETAILED DESCRIPTION

Figure 1:
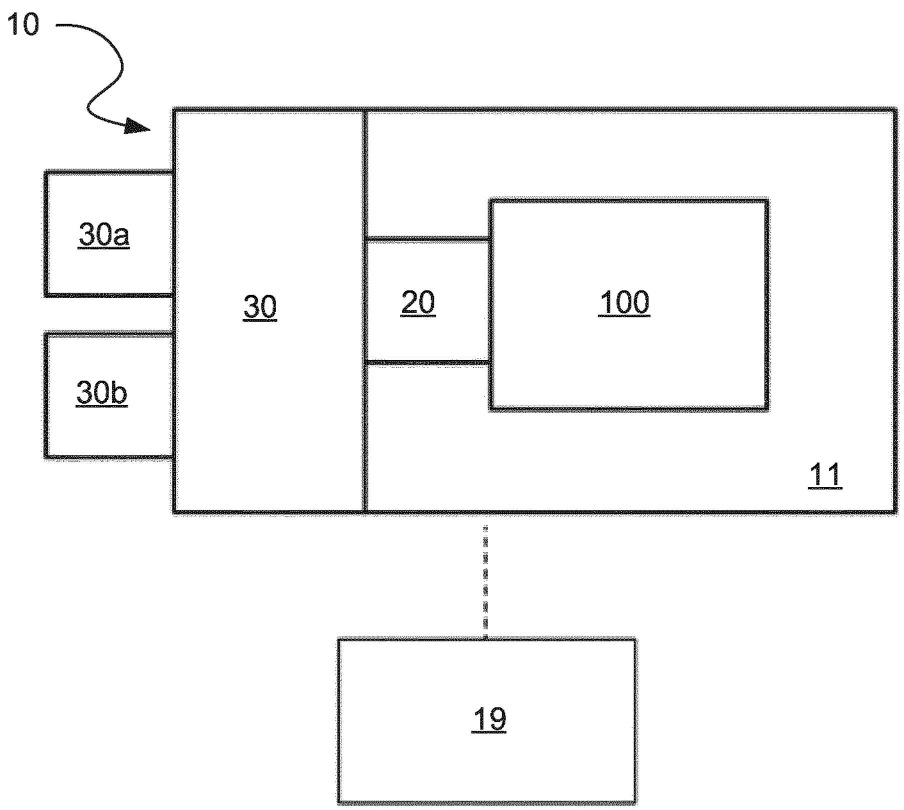
FIG. 1 is a schematic diagram illustrating an exemplary electron beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatus, and methods consistent with aspects related to the invention as recited in the appended claims. Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to recur.

As the name implies, SEMs use beams of electrons because such beams can be used to see structures that are too small to be seen by optical microscopes, that is, microscopes using light. Here and elsewhere herein the term "light" is used to mean not just visible light but also light that has wavelengths outside of those that are visible. The path of the electrons can be affected by the electrical and magnetic fields the electrons encounter as they travel to the substrate. This means it is necessary to control these fields. One way to control the fields is to use metal shielding plates. There are instances, however, in which it is desirable to have the ability to inspect the substrate not only with an SEM but also with an optical microscope. Providing this capability may involve putting one or more holes in the metal shielding plates through which the optical microscope can see the substrate. The presence of the holes, however, may interfere with the ability of the metal shielding plate to control the fields.

An example of a technical challenge addressed by some embodiments is to provide the optical microscope with a line of sight to the substrate without compromising the ability of the shielding plates to control the electrical fields. Some of these embodiments address this challenge by, e.g., using a field shaping element in or near the hole. The field shaping element may be a window element placed in the hole that is both transparent to the light being used by the optical microscope and electrically conductive. Because the window is electrically conductive, the shielding plate looks whole and uninterrupted to the electrical field, so that the shielding plate's ability to control the field is not diminished. The field shaping element may be a raised portion of conductive material next to the hole. The raised portion shapes the field so that the shielding plate's ability to control the field is not diminished. These field shaping elements may be used singly or together.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to photons, x-rays, and ions, etc. Furthermore, the term "beam" may refer to primary electron beams, primary electron beamlets, secondary electron beams, or secondary electron beamlets, among others.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

In the description and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

Reference is now made to FIG. 1, which illustrates an exemplary electron beam inspection (EBI) system 10, consistent with embodiments of the present disclosure. As shown in FIG. 1, EBI system 10 includes a main chamber 11, a load/lock chamber 20, an electron beam tool 100, and an equipment front end module (EFEM) 30. Electron beam tool 100 is located within main chamber 11.

EFEM 30 includes a first loading port 30*a* and a second loading port 30*b*. EFEM 30 may include additional loading port(s). First loading port 30*a* and second loading port 30*b* may, for example, receive wafer front opening unified pods (FOUPs) that contain wafers (e.g., semiconductor wafers or wafers made of other material(s)) or samples to be inspected (wafers and samples may be collectively referred to as "wafers" hereafter). One or more robotic arms (not shown) in EFEM 30 may transport the wafers to load/lock chamber 20.

Load/lock chamber 20 is connected to a load/lock vacuum pump system (not shown) that removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown), which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 19 is electronically connected to electron beam tool 100. While controller 19 is shown in FIG. 1 as being outside of the structure that includes main chamber 11, load/lock chamber 20, and EFEM 30, it is appreciated that controller 19 may be part of the structure.

While the present disclosure provides examples of main chamber 11 housing an electron beam inspection system, it should be noted that aspects of the disclosure in their broadest sense, are not limited to a chamber housing an electron beam inspection system. Rather, it is appreciated that the principles discussed herein may also be applied to other tools that operate under the second pressure.

Figure 2:
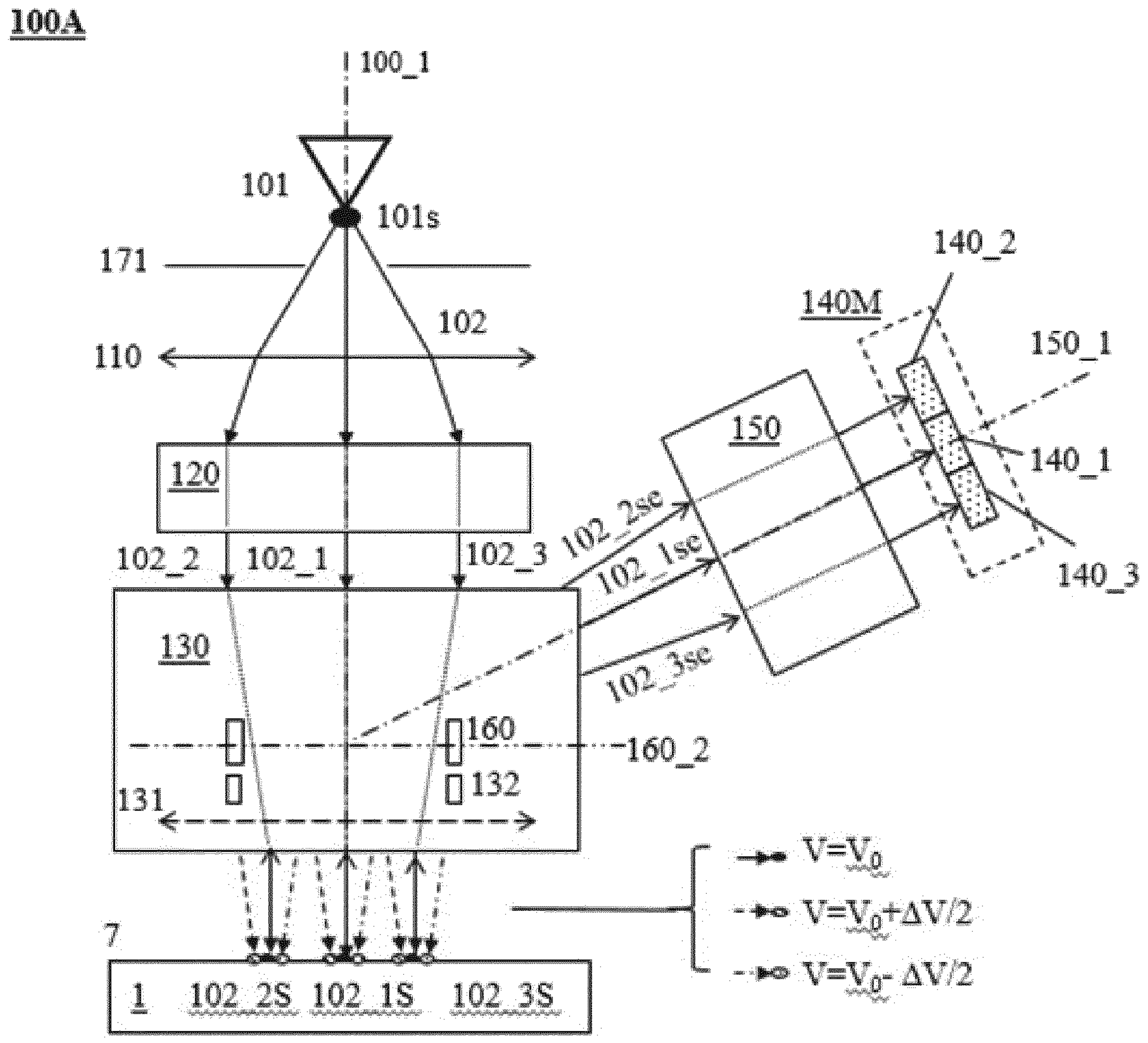
FIG. 2 is a schematic diagram illustrating additional aspects of an exemplary electron beam inspection system, consistent with embodiments of the present disclosure.

FIG. 2 illustrates an exemplary electron beam tool 100A that may be part of the EBI system of FIG. 1. An electron beam tool 100A (also referred to herein as "apparatus 100A") comprises an electron source 101, a gun aperture plate 171, a condenser lens 110, a source conversion unit 120, a primary projection optical system 130, a secondary imaging system 150, and an electron detection device 140M. Primary projection optical system 130 may comprise an objective lens 131. A sample 1 with sample surface 7 may be provided on a movable stage (not shown). Electron detection device 140M may comprise a plurality of detection elements 140_1, 140_2, and 140_3. A beam separator 160 and a deflection scanning unit 132 may be placed inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100A. Secondary imaging system 150 and electron detection device 140M may be aligned with a secondary optical axis 150_1 of apparatus 100A.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam 102 that forms a primary beam crossover (virtual or real) 101*s*. Primary electron beam 102 may be visualized as being emitted from primary beam crossover 101*s*.

Source conversion unit 120 may comprise an image-forming element array (not shown in FIG. 2) and a beam-limit aperture array (not shown in FIG. 2). The image-forming element array may comprise a plurality of micro-deflectors or micro-lenses that may influence a plurality of primary beamlets 102_1, 102_2, 102_3 of primary electron beam 102 and form a plurality of parallel images (virtual or real) of primary beam crossover 101*s*, one for each of the primary beamlets 102_1, 201_2, 102_3. The beam-limit aperture array may be configured to limit diameters of individual primary beamlets 102_1, 102_2, and 102_3. FIG. 2 shows three primary beamlets 102_1, 102_2, and 102_3 as an example, and it is appreciated that source conversion unit 120 may be configured to form any number of primary beamlets. For example, source conversion unit 120 may be configured to form a 3×3 array of primary beamlets. Source conversion unit 120 may further comprise an aberration compensator array configured to compensate aberrations of probe spots, 102_1S, 102_2S, and 102_3S. In some embodiments, the aberration compensator array may include a field curvature compensator array with micro-lenses that are configured to compensate field curvature aberrations of probe spots, 102_1S, 102_2S, and 102_3S, respectively. In some embodiments, the aberration compensator array may include an astigmatism compensator array with micro-stigmators that are configured to compensate astigmatism aberrations of probe spots, 102_1S, 102_2S, and 102_3S, respectively. In some embodiments, the image-forming element array, the field curvature compensator array, and the astigmatism compensator array may comprise multiple layers of micro-deflectors, micro-lenses, and micro-stigmators, respectively.

Condenser lens 110 is configured to focus primary electron beam 102. Condenser lens 110 may further be configured to adjust electric currents of primary beamlets 102_1, 102_2, and 102_3 downstream of source conversion unit 120 by varying the focusing power of condenser lens 110.

Beamlets 102_1, 102_2, and 102_3 may thereby have a focusing status that may be changed by condenser lens 110. Alternatively, the electric currents may be changed by altering the radial sizes of beam-limit apertures within the beam-limit aperture array corresponding to the individual primary beamlets. Thus, current of a beamlet may be different at different locations along the beamlet's trajectory. Beamlet current may be adjusted so that current of the beamlet on the sample surface (e.g., probe spot current) is set to a desired amount.

Condenser lens 110 may be a movable condenser lens that may be configured so that the position of its first principle plane is movable. The movable condenser lens may be configured to be magnetic, or electrostatic, or electromagnetic (e.g., compound). A movable condenser lens is further described in U.S. Pat. No. 9,922,799 and U.S. Patent Application Pub. No. 2017/0025243, both of which are incorporated herein in their entirety. In some embodiments, the condenser lens may be an anti-rotation lens, which may keep rotation angles of off-axis beamlets unchanged while varying the electric currents of the beamlets. In some embodiments, condenser lens 110 may be a movable anti-rotation condenser lens, which involves an anti-rotation lens with a movable first principal plane. An anti-rotation or movable anti-rotation condenser lens is further described in International Application No. PCT/EP2017/084429, which is incorporated by reference in its entirety.

Objective lens 131 may be configured to focus beamlets 102_1, 102_2, and 102_3 onto sample 1 for inspection and may form, in the current embodiment, three probe spots 102_1S, 102_2S, and 102_3S on surface 7. Gun aperture plate 171, in operation, is configured to block off peripheral electrons of primary electron beam 102 to reduce Coulomb effect. The Coulomb effect may enlarge the size of each of probe spots 102_1S, 102_2S, and 102_3S of primary beamlets 102_1, 102_2, 102_3, and therefore deteriorate inspection resolution.

Beam separator 160 may, for example, be a Wien filter comprising an electrostatic deflector generating an electrostatic dipole field E1 and a magnetic dipole field B1. Beam separator 160 may employ Lorentz force to influence electrons passing therethrough. Beam separator 160 may be activated to generate electrostatic dipole field E1 and magnetic dipole field B1. In operation, beam separator 160 may be configured to exert an electrostatic force by electrostatic dipole field E1 on individual electrons of primary beamlets 102_1, 102_2, and 102_3. The electrostatic force may be equal in magnitude but opposite in direction to the magnetic force exerted by magnetic dipole field B1 of beam separator 160 on the individual electrons. Primary beamlets 102_1, 102_2, and 102_3 may pass substantially straight through beam separator 160.

Deflection scanning unit 132, in operation, is configured to deflect primary beamlets 102_1, 102_2, and 102_3 to scan probe spots 102_1S, 102_2S, and 102_3S across individual scanning areas in a section of surface 7. In response to illumination of sample 1 by primary beamlets 102_1, 102_2, and 102_3 at probe spots 102_1S, 102_2S, and 102_3S, secondary electrons emerge from sample 1 and form three secondary electron beams 102_1*se*, 102_2*se*, and 102_3*se*, which, in operation, are emitted from sample 1. Each of secondary electron beams 102_1*se*, 102_2*se*, and 102_3*se* typically comprise electrons having different energies including secondary electrons (having electron energy ≤50 eV) and backscattered electrons (having electron energy between 50 eV and the landing energy of primary beamlets 102_1, 102_2, and 102_3). Beam separator 160 is configured to deflect secondary electron beams 102_1*se*, 102_2*se*, and 102_3*se* toward secondary imaging system 150. Secondary imaging system 150 subsequently focuses secondary electron beams 102_1*se*, 102_2*se*, and 102_3*se* onto detection elements 140_1, 140_2, and 140_3 of electron detection device 140M. Detection elements 140_1, 140_2, and 140_3 are arranged to detect corresponding secondary electron beams 102_1*se*, 102_2*se*, and 102_3*se* and generate corresponding signals that may be sent to signal processing units (not shown) to, for example, construct images of the corresponding scanned areas of sample 1.

Figure 3:
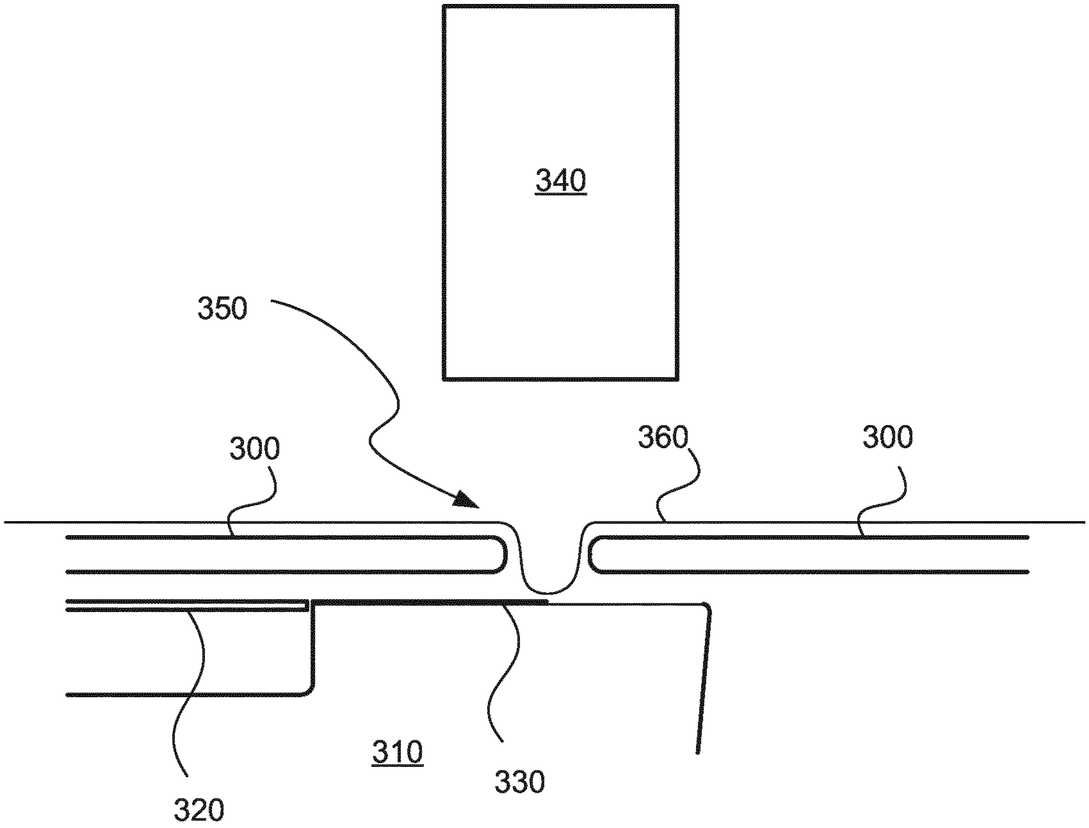
FIG. 3 is a side view diagram illustrating additional aspects of an exemplary electron beam inspection system, consistent with embodiments of the present disclosure.

As shown in FIG. 3, the EBI may include a flat metal plate 300 positioned slightly above the wafer stage 310. The wafer stage 310 supports an article such as the wafer 320 to be inspected, and moves the wafer relative to the metal plate 300. In the example of FIG. 3, the wafer 320 is surrounded by a conductive surface 330 which is part of the wafer stage 310. The wafer stage 310 is connected to the same voltage as the wafer 320 to create a homogeneous electrical field over the wafer stage 310 at all positions over its range of lateral motion including around the inspected area. There is generally, however, an edge of the conductive surface 330 around the article. At that edge, the electric field should not have a tangential component, in other words, the equipotential surface should be as parallel to the conductive surface 330 as possible.

In other words the plate 300 may be arranged so that the electric field between the plate 300 and the wafer stage 310 has a minimal component parallel to the conductive surface at the stage. This is also in preventing discharges due to high electric fields around the edge of the wafer stage 310 where a conductive coating 330 on the wafer stage 310 ends.

However, for visual inspection and alignment of the wafer 320 and stage 310, an optical measurement device 340 such as an optical microscope is also included. The optical measurement device 340 may be any optical alignment or inspection apparatus including instruments using, for example, interference, moiré patterns, or phase altering gratings, that requires a line of sight. The optical measurement device 340 is arranged looking downward (toward the wafer 320 and stage 310) through an aperture 350 in the plate 300, and wafer stage 310 moves wafer 320 to enable visual inspection of locations on wafer 320 located under aperture 350. The aperture 350 may have any shape, for example, it may be circular. Also, other optical devices, as well as other devices in general, may require apertures in the plate 300.

As used herein, the term "light" is not limited to visible light, and is instead broad enough to encompass portions of the electromagnetic spectrum that are not visible. According to an aspect of an embodiment an optical measurement device is used that is sensitive to visible light (having a wavelength on the range of about 380 nm to about 700 nm), but other optical measurement devices such as those sensitive to infrared or near-UV could be used. In general the light would have a wavelength in the range of about 300 nm to about 1100 nm.

The apertures 350 result in local deviations of the electric potential in the space between the plate 300 and the wafer stage 310 or wafer 320. As the stage 310 is translated laterally the edge of the wafer stage 310 and other features of the wafer stage 310 may pass beneath these apertures 350. If measures are not taken to prevent it, the area under the aperture 350 may be subjected to a tangential component of the electric field as shown by line 360. This may damage the edge of the conductive coating 330 on the stage 310 by causing discharges and/or arcing. Discharges can result in unwanted particles and contamination and local gas pressure increases, which in turn can result in electrical breakdown. Discharges can also occur near other portions of the wafer 320 and may damage them.

According to an aspect of an embodiment, an electrically conductive window element is provided to prevent a component of the electric field tangential to the stage. Deviations of the electrical potential at the locations of the apertures in the shielding plate 300 are reduced, and so also discharges by field emission.

The window element is a conductive but optically transparent element positioned in or at the apertures. This element can be, for example, a bulk material that is itself conductive and transparent. In can also be a transparent material with a conductive film. It can also be a screen.

Figure 4:
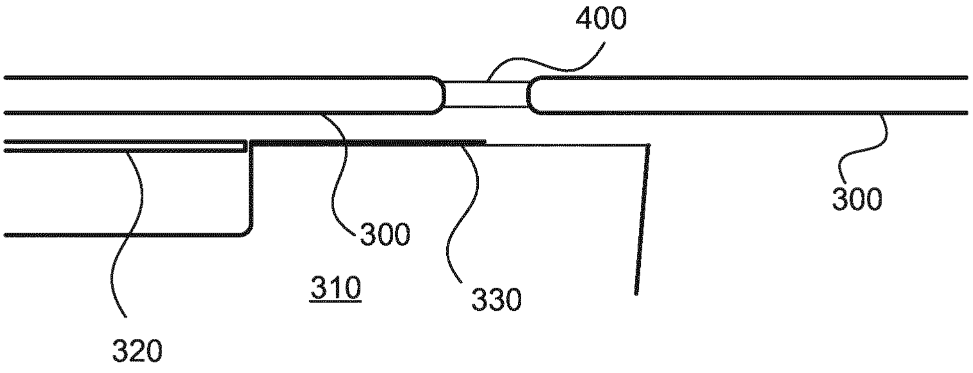
FIG. 4 is a side view diagram illustrating aspects of an exemplary electron beam inspection system according to an aspect of an embodiment.

FIG. 4 shows a window element 400 which is made of a material that is both transparent and electrically conductive. The material may be, for example, a conductive material like ITO (indium tin oxide) that is transparent for at least the portion of the light spectrum used by the optical measurement device. The material could be another transparent conductive oxide, or graphene. Carbon nanotubes may be used. A doped transparent semiconductor would fulfill the conductivity requirement as well. A crystalline material may be used or an amorphous material may be used such as a conductive polymer. These are examples and other materials may also be used.

Figure 5:
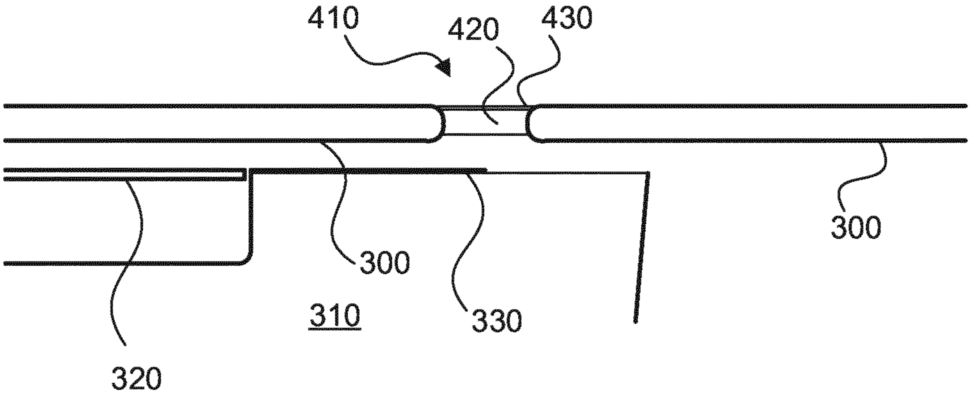
FIG. 5 is a side view diagram illustrating aspects of an exemplary electron beam inspection system according to an aspect of an embodiment.

FIG. 5 shows an example of a window element 410 made of a first material 420 that is transparent but not necessarily electrically conductive with a conductive film 430. For example, the window element 410 may be a glass body 420 that is coated with a thin conductive film 430 made of, for example, gold or aluminum. Other metals such as titanium and chromium may be used. The film 430 may be applied by vapor deposition or any other suitable technique.

A coating 430 having a thickness above a threshold, such as about 10 nm, would be sufficiently thick to provide the requisite conductivity. A coating 430 having a thickness of less than a threshold, such as about 1 μm, would provide sufficient optical transmission. Typically such a coating 430 may have a thickness in a range of about 10 nm to about 10 μm. In the specific embodiment shown in FIG. 5 the conductive coating 430 is shown as being on the top surface of the first material, but it will be apparent to one of ordinary skill in the art that the coating 430 may be on just the top surface, just the bottom surface, or both the top and bottom surfaces of the first material.

Figure 6:
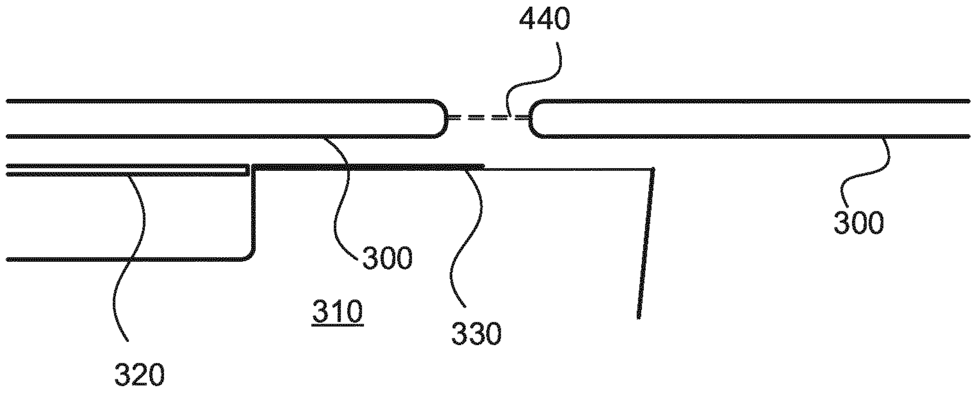
FIG. 6 is a side view diagram illustrating aspects of an exemplary electron beam inspection system according to an aspect of an embodiment.

As shown in FIG. 6, an alternative, a window element may be made up of a conductive screen 440 which is placed at a position on the optical axis outside the focus range, for example, in a pupil plane of the optics such that it does not disturb the imaging functions. The screen 440 may be woven (e.g., a mesh of metal wires or nanowires) or nonwoven (grid) and have a mesh structure that is sufficiently open to permit the passage of light at the wavelengths of interest. For example, the screen 440 may have a structure that leaves at least a third of its surface area open to permit the passage of light.

The thickness and vertical (direction of plate thickness) positioning of the window element may be selected so that the window element does not protrude past the upper or lower surface of the plate 300. Thus the window element may have a thickness about the same as or less than the thickness of the plate 300. If the thickness of the window element is less than the thickness of the plate 300 then the surface of the window element is recessed from one of the surfaces of the plate 300.

Figure 7:
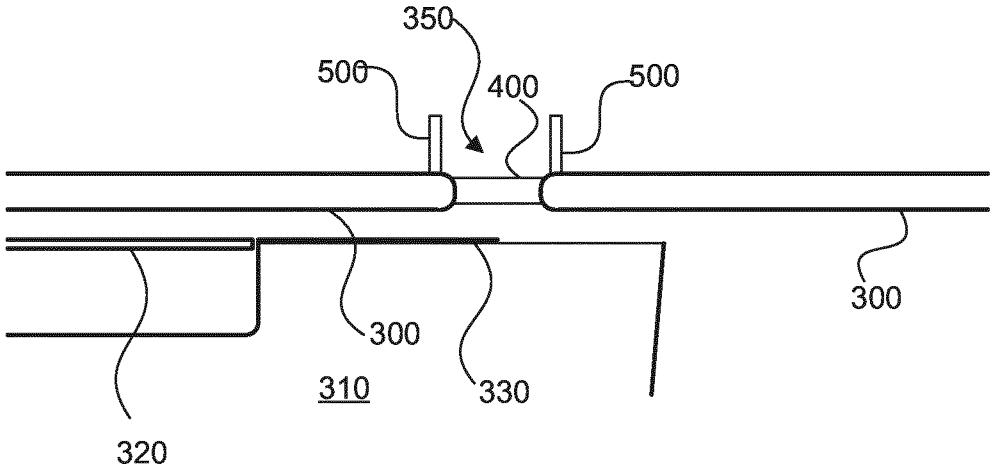
FIG. 7 is a side view diagram illustrating aspects of an exemplary electron beam inspection system according to an aspect of an embodiment.

As shown in FIG. 7, according to another aspect of an embodiment, for some applications the edge around the aperture 350 on the upper side of the plate 300 has a raised portion 500. The raised portion 500 may be formed integrally with the plate 300 or may be added to the plate 300 by a process such as welding. The raised edge 500 is made of a conductive material. The raised portion 500 may have a height such that the height of the aperture is about the same as or is greater than its width, e.g., diameter if the aperture is circular, otherwise its longest linear dimension. The raised edge 500 shapes the electric field to provide another measure to prevent tangential components of the electric field at the surface of the wafer stage 310. Also, the raised edge or area 500 permits the lateral size of the aperture 350 to be larger.

Figure 8:
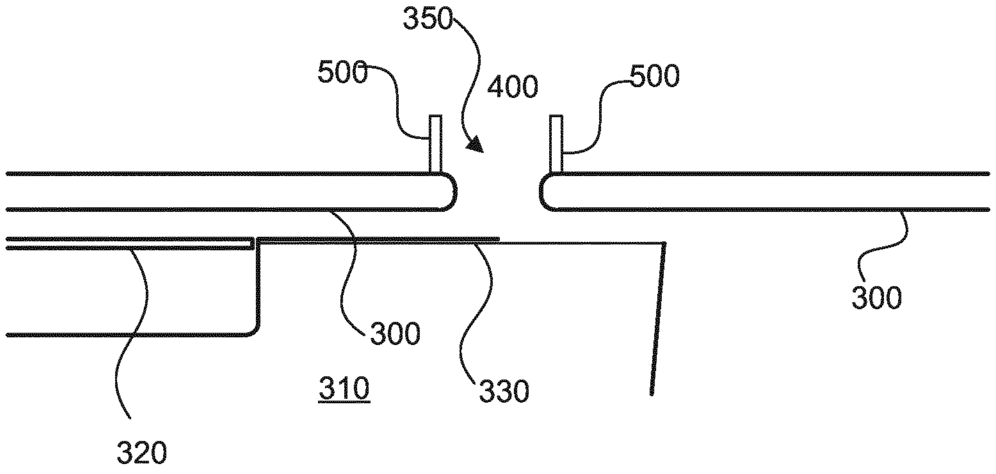
FIG. 8 is a side view diagram illustrating aspects of an exemplary electron beam inspection system according to an aspect of an embodiment.

For some applications the raised edge by itself may shape the electrical field sufficiently that a separate window element is unnecessary. Such an arrangement is shown in FIG. 8. Again, the raised portion 500 may be formed integrally with the plate 300 or may be added to the plate 300 by a process such as welding. The raised edge 500 is made of a conductive material. The raised portion 500 may have a height such that the height of the aperture is about the same as or is greater than its width, e.g., diameter if the aperture is circular, otherwise its longest linear dimension. The raised edge 500 shapes the electric field to prevent tangential components of the electric field at the surface of the wafer stage 310. Also, the raised edge or area 500 permits the lateral size of the aperture 350 to be larger.

The embodiments may further be described using the following clauses:

1. An article comprising:
   a substantially planar plate comprising an electrically conductive material and structure defining a through aperture; and
   a field shaping element positioned at the through aperture, the field shaping element being configured to counteract effects of the through aperture on an electric field near the substantially planar plate.
2. The article of clause 1 wherein the field shaping element comprises a window element positioned at the through aperture, the window element being electrically conductive and transmissive to light.
3. The article of clause 2 wherein the window element comprises an electrically conductive material transmissive to visible light having a wavelength in the range of about 300 nm to about 1100 nm.
4. The article of any one of clauses 2 or 3 wherein the window element comprises a transparent metal oxide.
5. The article of any one of clauses 2-4 wherein the window element comprises indium tin oxide.
6. The article of any one of clauses 2 or 3 wherein the window element comprises graphene.
7. The article of any one of clauses 2 or 3 wherein the window element comprises carbon nanotubes.
8. The article of any one of clauses 2 or 3 wherein the window element comprises an amorphous material.
9. The article of any one of clauses 2 or 3 wherein the window element comprises a doped transparent semiconductor.
10. The article of any one of clauses 2 or 3 wherein the window element comprises a conductive polymer.
11. The article of clause 2 wherein the window element comprises a body comprising a transparent material and coating of a conductive material.
12. The article of clause 11 wherein the coating of a conductive material comprises gold.

13. The article of clause 11 wherein the coating of a conductive material comprises aluminum.
14. The article of clause 11 wherein the coating of a conductive material comprises titanium.
15. The article of clause 11 wherein the coating of a conductive material comprises chromium.
16. The article of any one of clauses 11-15 wherein the coating has a thickness in a range of about 10 nm to about 10 μm.
17. The article of clause 2 wherein the window element comprises a screen configured to be electrically conductive and transmissive to visible light.
18. The article of clause 17 wherein the screen comprises a mesh.
19. The article of clause 18 wherein the mesh comprises metallic wires.
20. The article of any one of clauses 18 or 19 wherein the mesh is at least 30% open.
21. The article of clause 17 wherein the screen is nonwoven.
22. The article of clause 21 wherein the screen is a grid.
23. The article of clause 22 where in the grid is at least 30% open.
24. The article of clause 2 wherein the window element is positioned in the aperture so as not to extend beyond a surface of the plate.
25. The article of clause 24 wherein the window element is positioned in the aperture so as to be recessed below a surface of the plate.
26. The article of clause 2 wherein an area of the plate adjacent the aperture is raised to define a raised rim at least partially surrounding the aperture.
27. The article of clause 26 wherein the raised rim is integral with the plate.
28. The article of clause 26 or 27 wherein the height of the raised rim is such that a height of the aperture together with a height of the raised rim is substantially equal to a width of the aperture.
29. The article of any one of clauses 26-28 wherein the aperture is circular and the width of the aperture is a diameter of the aperture.
30. The article of clause 1 wherein the field shaping element comprises an area of the plate adjacent the aperture raised to define a raised rim at least partially surrounding the aperture, the raised rim comprising an electrically conductive material.
31. The article of clause 30 wherein the raised rim is integral with the plate.
32. The article of clause 30 or 31 wherein the height of the raised rim is such that a height of the aperture together with a height of the raised rim is substantially equal to or greater than a width of the aperture.
33. The article of any one of clauses 30-32 wherein the aperture is circular and the width of the aperture is a diameter of the aperture.
34. An inspection tool comprising:
  - a stage arranged to support an article to be inspected and to connect the article to a voltage source;
  - a substantially planar plate comprising an electrically conductive material and arranged parallel to and separated from the stage by a gap and to regulate an electrical field in the gap, the plate further comprising structure defining a through aperture; and
  - a field shaping element positioned at the through aperture, the field shaping element being configured to counteract effects of the through aperture on an electric field near the substantially planar plate.
35. The inspection tool of clause 34 wherein the field shaping element comprises a window element positioned at the through aperture, the window element being electrically conductive and transmissive to light.
36. The inspection tool of clause 35 wherein the window element comprises an electrically conductive material transmissive to visible light having a wavelength in the range of about 300 nm to about 1100 nm.
37. The inspection tool of clause 35 or 36 wherein the window element comprises a transparent metal oxide.
38. The inspection tool of any one of clauses 35-37 wherein the window element comprises indium tin oxide.
39. The inspection tool of any one of clauses 35-36 wherein the window element comprises graphene.
40. The inspection tool of any one of clauses 35-36 wherein the window element comprises carbon nanotubes.
41. The inspection tool of any one of clauses 35-36 wherein the window element comprises an amorphous material.
42. The inspection tool of any one of clauses 35-36 wherein the window element comprises a doped transparent semiconductor.
43. The inspection tool of any one of clauses 35-36 wherein the window element comprises a conductive polymer.
44. The inspection tool of any one of clauses 35-36 wherein the window element comprises a body comprising a transparent material and coating of a conductive material.
45. The inspection tool of clause 44 wherein the coating of a conductive material comprises gold.
46. The inspection tool of clause 44 wherein the coating of a conductive material comprises aluminum.
47. The inspection tool of clause 44 wherein the coating of a conductive material comprises titanium.
48. The inspection tool of clause 44 wherein the coating of a conductive material comprises chromium.
49. The inspection tool of any one of clauses 44-48 wherein the coating has a thickness in a range of about 10 nm to about 10 μm.
50. The inspection tool of clause 35 wherein the window element comprises a screen configured to be electrically conductive and transmissive to visible light.
51. The inspection tool of clause 50 wherein the screen comprises a mesh.
52. The inspection tool of clause 51 wherein the mesh comprises metallic wires.
53. The inspection tool of clause 51 or 52 wherein the mesh is at least 30% open.
54. The inspection tool of clause 50 wherein the screen is nonwoven.
55. The inspection tool of clause 54 wherein the screen is a grid.
56. The inspection tool of clause 55 where in the grid is at least 30% open.
57. The inspection tool of clause 35 wherein the window element is positioned in the aperture so as not to extend beyond a surface of the plate.
58. The inspection tool of clause 35 or 57 wherein the window element is positioned in the aperture so as to be recessed below a surface of the plate.
59. The inspection tool of any one of clauses 35-58 wherein an area of the plate adjacent the aperture is raised to define a raised rim at least partially surrounding the aperture, wherein the raised rim comprises a conductive material.

60. The inspection tool of clause 59 wherein the raised rim is integral with the plate.

61. The inspection tool of clause 59 or 60 wherein the height of the raised rim is such that a height of the aperture together with a height of the raised rim is substantially equal to a width of the aperture.

62. The inspection tool of any one of clauses 59-61 wherein the aperture is circular and the width of the aperture is a diameter of the aperture.

63. The inspection tool of clause 31 wherein the field shaping element comprises an area of the plate adjacent the aperture raised to define a raised rim at least partially surrounding the aperture, the raised rim comprising an electrically conductive material.

64. The inspection tool of clause 63 wherein the raised rim is integral with the plate.

65. The inspection tool of clause 63 or 64 wherein the height of the raised rim is such that a height of the aperture together with a height of the raised rim is substantially equal to or greater than a width of the aperture.

66. The inspection tool of any one of clauses 63-65 wherein the aperture is circular and the width of the aperture is a diameter of the aperture.

67. An inspection tool comprising:

a stage arranged to support an article to be inspected and to connect the article to a voltage source;

a substantially planar plate comprising an electrically conductive material and arranged parallel to and separated from the stage by a gap and to regulate an electrical field in the gap, the plate further comprising structure defining a through aperture;

a field shaping element positioned at the through aperture, the field shaping element being configured to counteract effects of the through aperture on an electric field near the substantially planar plate; and an optical measurement device arranged to view the stage through the window element.

68. The inspection tool of clause 67 wherein the field shaping element comprises a window element positioned at the through aperture, the window element being electrically conductive and transmissive to light.

69. The inspection tool of clause 68 wherein the window element comprises an electrically conductive material transmissive to visible light having a wavelength in the range of about 300 nm to about 1100 nm.

70. The inspection tool of clause 68 or 69 wherein the window element comprises a transparent metal oxide.

71. The inspection tool of any one of clauses 68-70 wherein the window element comprises indium tin oxide.

72. The inspection tool of clause 68 or 69 wherein the window element comprises graphene.

73. The inspection tool of clause 68 or 69 wherein the window element comprises carbon nanotubes.

74. The inspection tool of clause 68 or 69 wherein the window element comprises an amorphous material.

75. The inspection tool of clause 68 or 69 wherein the window element comprises a doped transparent semiconductor.

76. The inspection tool of clause 68 or 69 wherein the window element comprises a conductive polymer.

77. The inspection tool of clause 68 wherein the window element comprises a body comprising a transparent material and coating of a conductive material.

78. The inspection tool of clause 77 wherein the coating of a conductive material comprises gold.

79. The inspection tool of clause 77 wherein the coating of a conductive material comprises aluminum.

80. The inspection tool of clause 77 wherein the coating of a conductive material comprises titanium.

81. The inspection tool of clause 77 wherein the coating of a conductive material comprises chromium.

82. The inspection tool of any one of clauses 77-81 wherein the coating has a thickness in a range of about 10 nm to about 10 μm.

83. The inspection tool of clause 55 wherein the window element comprises a screen configured to be electrically conductive and transmissive to visible light.

84. The inspection tool of clause 70 wherein the screen comprises a mesh.

85. The inspection tool of clause 71 wherein the mesh comprises metallic wires.

86. The inspection tool of clause 71 or 72 wherein the mesh is at least 30% open.

87. The inspection tool of clause 55 wherein the screen is nonwoven.

88. The inspection tool of clause 83 wherein the screen is a grid.

89. The inspection tool of clause 88 where in the grid is at least 30% open.

90. The inspection tool of clause 68 wherein the window element is positioned in the aperture so as not to extend beyond a surface of the plate.

91. The inspection tool of clause 90 wherein the window element is positioned in the aperture so as to be recessed below a surface of the plate.

92. The inspection tool of any one of clauses 68-91 wherein an area of the plate adjacent the aperture is raised to define a raised rim at least partially surrounding the aperture, wherein the raised rim comprises a conductive material.

93. The inspection tool of clause 92 wherein the raised rim is integral with the plate.

94. The inspection tool of clause 92 or 93 wherein the height of the raised rim is such that a height of the aperture together with a height of the raised rim is substantially equal to a width of the aperture.

95. The inspection tool of any one of clauses 92-94 wherein the aperture is circular and the width of the aperture is a diameter of the aperture.

96. The inspection tool of clause 67 wherein the field shaping element comprises an area of the plate adjacent the aperture raised to define a raised rim at least partially surrounding the aperture, the raised rim comprising an electrically conductive material.

97. The inspection tool of clause 96 wherein the raised rim is integral with the plate.

98. The inspection tool of clause 96 or 97 wherein the height of the raised rim is such that a height of the aperture together with a height of the raised rim is substantially equal to or greater than a width of the aperture.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. An article, comprising:

a substantially planar plate comprising an electrically conductive material and structure defining a through aperture, the through aperture configured to be positioned above a conductive surface of a wafer stage; and a field shaping element positioned at the through aperture, the field shaping element being configured to counteract effects of the through aperture on an electric field near the substantially planar plate to minimize or prevent a component of the electrical field from being tangential to the conductive surface of the wafer stage, the field shaping element being electrically conductive and transmissive to light.

2. An article as claimed in claim 1 wherein the field shaping element comprises a window element positioned at the through aperture.

3. An article as claimed in claim 2 wherein the window element comprises an electrically conductive material transmissive to visible light having a wavelength in the range of about 300 nm to about 1100 nm.

4. An article as claimed in claim 2 wherein:

the window element comprises a transparent metal oxide; and the window element being transmissive to light includes the window element being optically transparent.

5. An article as claimed in claim 2 wherein the window element comprises indium tin oxide.

6. An article as claimed in claim 2 wherein the window element comprises graphene.

7. An article as claimed in claim 2 wherein the window element comprises carbon nanotubes.

8. An article as claimed in claim 2 wherein the window element comprises a doped transparent semiconductor.

9. An article as claimed in claim 2 wherein the window element comprises a conductive polymer.

10. An article as claimed in claim 2 wherein the window element comprises a body comprising a transparent material and coating of a conductive material.

11. An article as claimed in claim 10 wherein the coating of a conductive material comprises gold.

12. An article as claimed in claim 10 wherein the coating of a conductive material comprises aluminum.

13. An article as claimed in claim 10 wherein the coating of a conductive material comprises titanium.

14. An article as claimed in claim 10 wherein the coating of a conductive material comprises chromium.

15. An article as claimed in claim 10 wherein the coating has a thickness in a range of about 10 nm to about 10 μm.

16. An article as claimed in claim 1 wherein the wafer stage comprises a non-conductive surface between the conductive surface and an edge of the wafer stage.

* * * * *